United States Patent
Yu et al.

(10) Patent No.: US 10,523,223 B2
(45) Date of Patent: Dec. 31, 2019

(54) PHASE-LOCKED LOOP CIRCUIT CALIBRATION METHOD, MEMORY STORAGE DEVICE AND CONNECTION INTERFACE CIRCUIT

(71) Applicant: PHISON ELECTRONICS CORP., Miaoli (TW)

(72) Inventors: Chia-Hui Yu, Hsinchu County (TW); Wei-Yung Chen, Hsinchu County (TW)

(73) Assignee: PHISON ELECTRONICS CORP., Miaoli (TW)

( * ) Notice: Subject to any disclaimer, the term of this patent is extended or adjusted under 35 U.S.C. 154(b) by 0 days.

(21) Appl. No.: 15/973,539

(22) Filed: May 8, 2018

(65) Prior Publication Data
US 2019/0288700 A1    Sep. 19, 2019

(30) Foreign Application Priority Data

Mar. 13, 2018 (TW) ............................ 107108508 A (51) Int. Cl.
| | |
|---|---|
| *H03L 7/10* | (2006.01) |
| *H03L 7/08* | (2006.01) |
| *G06F 13/42* | (2006.01) |
| *G06F 13/16* | (2006.01) |
| *H03L 7/099* | (2006.01) |

(52) U.S. Cl.
CPC .......... *H03L 7/102* (2013.01); *G06F 13/1668* (2013.01); *G06F 13/42* (2013.01); *H03L 7/099* (2013.01); *H03L 7/08* (2013.01)

(58) Field of Classification Search
CPC .................................. H03L 7/08; H03L 7/102
See application file for complete search history.

(56) References Cited

U.S. PATENT DOCUMENTS

| | | | | |
|---|---|---|---|---|
| 2010/0271092 A1* | 10/2010 | Zerbe | ................... | G06F 13/4243 327/161 |
| 2012/0025880 A1* | 2/2012 | Romano | ................... | H03L 7/07 327/156 |
| 2013/0257497 A1 | 10/2013 | Thelen et al. | | |
| 2016/0041212 A1* | 2/2016 | Darbinyan | ......... | G01R 29/0273 327/33 |

FOREIGN PATENT DOCUMENTS

TW    201506580    2/2015

OTHER PUBLICATIONS

"Office Action of Taiwan Counterpart Application," dated Oct. 18, 2018, pp. 1-7.

* cited by examiner

*Primary Examiner* — Zachary K Huson
(74) *Attorney, Agent, or Firm* — JCIPRNET (57) ABSTRACT

A phase-locked loop circuit calibration method for a memory storage device including a rewritable non-volatile memory module is provided according to an exemplary embodiment of the disclosure. The method includes: receiving a first signal from a host system; generating a jitter signal by the memory storage device; generating a second signal according to the first signal and the jitter signal; performing a phase-lock operation on the second signal to generate a third signal by a phase-locked loop circuit; and detecting the third signal to calibrate an electronic parameter of the phase-locked loop circuit.

27 Claims, 8 Drawing Sheets

PHASE-LOCKED LOOP CIRCUIT CALIBRATION METHOD, MEMORY STORAGE DEVICE AND CONNECTION INTERFACE CIRCUIT

CROSS-REFERENCE TO RELATED APPLICATION

This application claims the priority benefit of Taiwan application serial no. 107108508, filed on Mar. 13, 2018. The entirety of the above-mentioned patent application is hereby incorporated by reference herein and made a part of this specification.

BACKGROUND

1. Technical Field

The disclosure relates to a calibration mechanism of a phase-locked loop (PLL) circuit, and particularly relates to a PLL circuit calibration method, a memory storage device, and a connection interface circuit.

2. Description of Related Art

Phase-locked loops (PLL) are commonly used in the field of communication. In a PLL, a reference signal and an output signal may be locked at the same frequency and phase based on a feedback signal to reduce signal errors generated at a receiving end circuit due to a frequency offset that occurs during a transmission process. In some applications, the loop bandwidth of the PLL needs to be controlled within a specific range. However, the loop bandwidth of the PLL is easily variable in correspondence with the external environment (e.g., temperature), a manufacturing error, or a voltage change. Therefore, it is not easy to calibrate the loop bandwidth of the PLL.

Nothing herein should be construed as an admission of knowledge in the prior art of any portion of the present disclosure. Furthermore, citation or identification of any document in this application is not an admission that such document is available as prior art to the present disclosure, or that any reference forms a part of the common general knowledge in the art.

SUMMARY

Exemplary embodiments of the disclosure provide a phase-locked loop circuit calibration method, a memory storage device, and a connection interface circuit capable of effectively calibrating electronic parameters of a phase-locked loop.

An exemplary embodiment of the disclosure provides a phase-locked loop circuit calibration method for a memory storage device including a rewritable non-volatile memory module. The phase-locked loop circuit calibration method includes the following steps. A first signal is received from a host system. A jitter signal is generated by the memory storage device. A second signal is generated based on the first signal and the jitter signal. A phase-lock operation is performed on the second signal by a phase-locked loop circuit to generate a third signal. The third signal is detected to calibrate an electronic parameter of the phase-locked loop circuit.

An exemplary embodiment of the disclosure provides a memory storage device. The memory storage device includes a connection interface unit, a rewritable non-volatile memory module, and a memory control circuit unit. The connection interface unit is coupled to a host system. The memory control circuit unit is coupled to the connection interface unit and the rewritable non-volatile memory module. The connection interface unit includes a phase-locked loop circuit. The connection interface unit is configured to receive a first signal from the host system. The connection interface unit is further configured to generate a jitter signal. The connection interface unit is further configured to generate a second signal based on the first signal and the jitter signal. The phase-locked loop circuit is configured to perform a phase-lock operation on the second signal to generate a third signal. The connection interface unit is further configured to detect the third signal to calibrate an electronic parameter of the phase-locked loop circuit.

An exemplary embodiment of the disclosure provides a connection interface circuit for connecting a memory storage device to a host system. The connection interface circuit includes a jitter control circuit, a jitter generation circuit, a phase-locked loop circuit, and a control circuit. The jitter control circuit is configured to generate a jitter signal. The jitter generation circuit is coupled to the jitter control circuit and configured to receive a first signal from the host system and generate a second signal based on the first signal and the jitter signal. The phase-locked loop circuit is coupled to the jitter generation circuit and configured to perform a phase-lock operation on the second signal to generate a third signal. The control circuit is coupled to the phase-locked loop circuit and the jitter control circuit and configured to detect the third signal to calibrate a circuit parameter of the phase-locked loop circuit.

Based on the above, after the first signal is received form the host system, the second signal may be generated based on the first signal and the jitter signal generated by the memory storage device itself. After the phase-lock operation is performed on the second signal to generate the third signal, the third signal may be detected to calibrate the electronic parameter of the phase-locked loop circuit. Accordingly, the efficiency of calibrating the electronic parameter of the phase-locked loop circuit is facilitated.

In order to make the aforementioned and other features and advantages of the disclosure comprehensible, several exemplary embodiments accompanied with figures are described in detail below.

It should be understood, however, that this Summary may not contain all of the aspects and embodiments of the present disclosure, is not meant to be limiting or restrictive in any manner, and that the disclosure as disclosed herein is and will be understood by those of ordinary skill in the art to encompass obvious improvements and modifications thereto.

DESCRIPTION OF THE EMBODIMENTS

Reference will now be made in detail to the present preferred embodiments of the disclosure, examples of which are illustrated in the accompanying drawings. Wherever possible, the same reference numbers are used in the drawings and the description to refer to the same or like parts.

Embodiments of the present disclosure may comprise any one or more of the novel features described herein, including in the Detailed Description, and/or shown in the drawings. As used herein, "at least one", "one or more", and "and/or" are open-ended expressions that are both conjunctive and disjunctive in operation. For example, each of the expressions "at least one of A, B and C", "at least one of A, B, or C", "one or more of A, B, and C", "one or more of A, B, or C" and "A, B, and/or C" means A alone, B alone, C alone, A and B together, A and C together, B and C together, or A, B and C together.

It is to be noted that the term "a" or "an" entity refers to one or more of that entity. As such, the terms "a" (or "an"), "one or more" and "at least one" can be used interchangeably herein.

Several embodiments are provided in the following of the disclosure. However, the disclosure shall not be limited to the embodiments exemplified herein. In addition, the exemplary embodiments may be properly combined with each other. Throughout the text of the disclosure (including claims), the term "couple" may refer to any direct or indirect connection means. For example, if it is described that a first device is coupled to a second device, it shall be interpreted that the first device may be directly connected to the second device, or the first device may be indirectly connected to the second device via another device or a connection means. Besides, the term "signal" may refer to at least one current, voltage, charge, temperature, data, or any other one or more signals.

Figure 1:
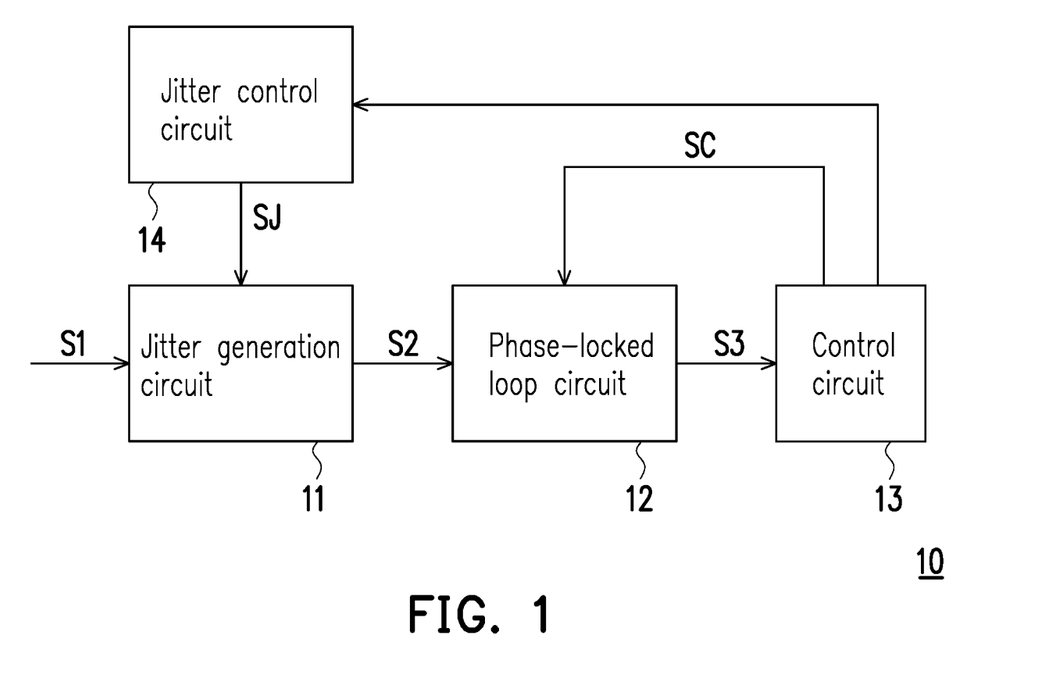
FIG. 1 is a schematic diagram illustrating a connection interface circuit according to an exemplary embodiment of the disclosure.

FIG. 1 is a schematic diagram illustrating a connection interface circuit according to an exemplary embodiment of the disclosure. Referring to FIG. 1, a connection interface circuit 10 includes a jitter generation circuit 11, a phase-locked loop (PLL) circuit 12, a control circuit 13, and a jitter control circuit 14. The jitter generation circuit 11 is coupled to the phase-locked loop circuit 12 and the jitter control circuit 14. The control circuit 13 is coupled to the phase-locked loop circuit 12 and the jitter control circuit 14.

The jitter control circuit 14 is configured to generate a signal (also referred to as a jitter signal) SJ and provide the signal SJ to the jitter generation circuit 11. The jitter generation circuit 11 is configured to receive a signal (also referred to as a first signal) S1 from a host system and the signal SJ. In an exemplary embodiment, the signal S1 may be a differential signal or a non-differential signal. For example, the signal S1 may include two signals having the same amplitude but opposite phases. In an exemplary embodiment, the signal SJ may be considered as noise artificially generated and/or generated on purpose. For example, the signal SJ may be a sinus wave, a square wave, a triangular wave, or a signal formed by these basic waves and having a consistent cycle. In an exemplary embodiment, a frequency (also referred to as clock frequency) of the signal SJ is not higher (e.g., equal to or lower) than a frequency of the signal S1. For example, the frequency of the signal SJ may be 3.5 MHz, and the frequency of the signal S1 may be 100 MHz. Nevertheless, in another exemplary embodiment, the frequencies of the signals SJ and S1 may be adjusted based on practical needs.

The jitter generation circuit 11 may generate a signal (also referred to as a second signal) S2 based on the signals S1 and SJ. In addition, the jitter generation circuit 11 may adjust the signal S1 based on the signal SJ, so that at least one rising edge or/and at least one falling edge of a bit stream of the signal S2 may have a time shift of a different amount. For example, the jitter generation circuit 11 may reflect the signal SJ into the signal S1 by using a logical circuit component, such as an adder, an injector, or a voltage controlled delay circuit, to generate the signal S2. In other words, by reflecting the signal SJ into the signal S1, a frequency, an amplitude, a cycle, or other electronic parameters of the signal S1 may be randomly modified.

The phase-locked loop circuit 12 may receive the signal S2 from the jitter generation circuit 11. The phase-locked loop circuit 12 may perform a phase-lock operation on the signal S2 to generate a signal (also referred as a third signal) S3. For example, the phase-locked loop circuit 12 may be a feedback circuit, and the phase-locked loop circuit 12 may lock frequencies and phases of the signals S2 and S3. For example, by using the phase-locked loop circuit 12, the frequency and the phase of the signal S3 may respectively approximate the frequency and the phase of the signal S2.

The control circuit 13 may detect the signal S3 to calibrate an electronic parameter, such as a loop bandwidth and/or a loop jitter peaking of the phase-locked loop circuit 12. For example, based on the detected signal S3, the control circuit 13 may output a signal (also referred to as a control signal) SC to the phase-locked loop circuit 12. The signal SC is adapted to instruct the phase-locked loop circuit 12 to use or adjust a specific circuit parameter. Based on the signal SC, the phase-locked loop circuit 12 may automatically use or adjust the specific circuit parameter and thereby calibrate the electronic parameter of the phase-locked loop circuit 12. Besides, the control circuit 13 may also control the jitter control circuit 14 to adjust the frequency, the amplitude, the cycle, or other electronic parameters of the signal SJ.

Conventionally, the electronic parameter, such as the loop bandwidth, of the phase-locked loop circuit 12 is easily variable in correspondence with the external environment (e.g., temperature), a manufacturing error, or a voltage change, so it is not easy to calibrate the loop bandwidth of the phase-locked loop. However, in the exemplary embodiment of FIG. 1, the signal SJ is reflected in the signal S1, and then the signal S3 is detected and the electronic parameter of the phase-locked loop circuit 12 is adjusted based on a detection result. Accordingly, the electronic parameter, such as the loop bandwidth and/or the loop jitter peaking of the phase-locked loop circuit 12 may be calibrated effectively.

Figure 2:
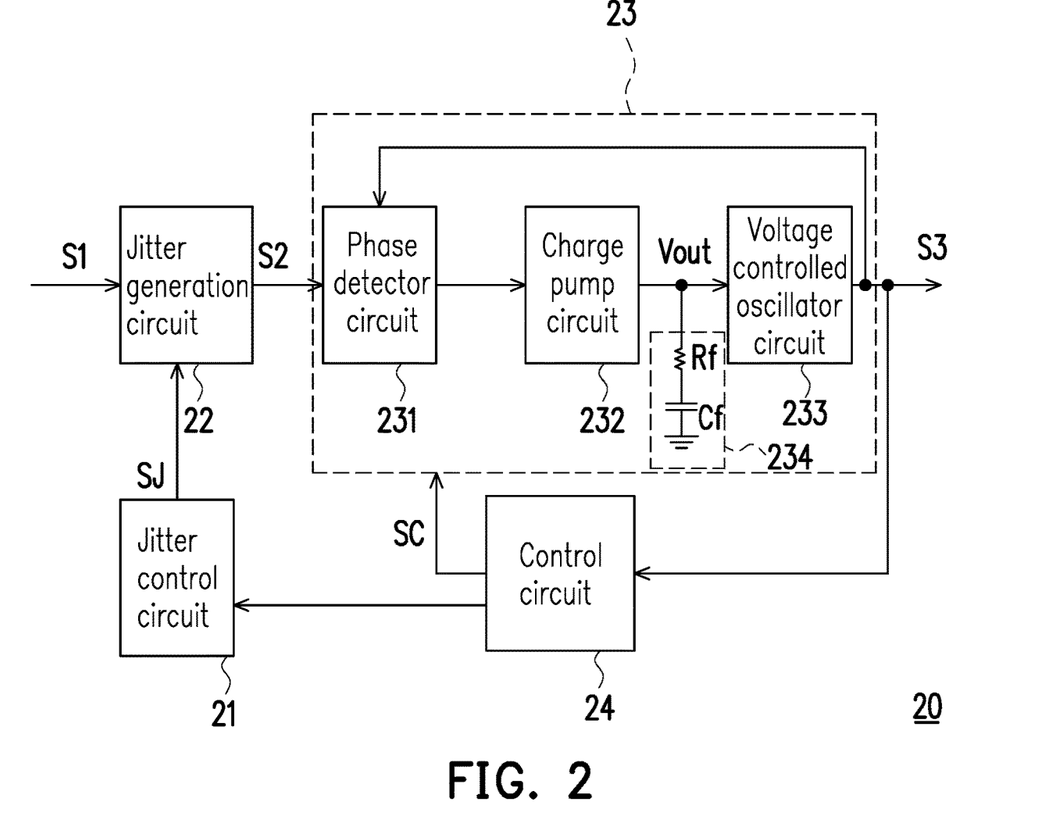
FIG. 2 is a schematic diagram illustrating a connection interface circuit according to another exemplary embodiment of the disclosure.

FIG. 2 is a schematic diagram illustrating a connection interface circuit according to another exemplary embodiment of the disclosure. Referring to FIG. 2, a connection interface circuit 20 includes a jitter control circuit 21, a jitter generation circuit 22, a phase-locked loop circuit 23, and a control circuit 24. The jitter control circuit 21 is configured to provide the signal SJ. For example, the jitter control circuit 21 may be identical to or similar with the jitter control circuit 14 in the exemplary embodiment of FIG. 1.

The jitter generation circuit 22 may receive the signal S1 and the signal SJ and generate the signal S2 based on the signals S1 and SJ. For example, the jitter generation circuit 22 may reflect the signal SJ into the signal S1 to affect the frequency, the amplitude, the cycle, or other electronic parameters of the signal S2. In an exemplary embodiment, the jitter generation circuit 22 may include a voltage controlled delay circuit. The voltage controlled delay circuit may be a delay line circuit and include a plurality of delay elements. The voltage controlled delay circuit may receive the signal S1 and delay the signal S1 based on the signal SJ to output the delayed signal S1 (i.e., the signal S2). Accordingly, the signal SJ may serve to control the frequency, the amplitude, the cycle, or other electronic parameters of the signal S1 (or the signal S2).

The phase-locked loop circuit 23 includes a phase detector (PD) circuit 231, a charge pump (CP) circuit 232, a voltage controlled oscillator (VCO) circuit 233, and a loop filter (LP) circuit 234. The charge pump circuit 232 is coupled to the phase detector circuit 231, the voltage controlled oscillator circuit 233, and the loop filter circuit 234. The phase detector circuit 231 is configured to compare the phases of the signals S2 and S3. The charge pump circuit 232 may output a boost or buck signal Vout based on a comparison result of the phase detector circuit 231.

The loop filter circuit 234 may be a low-pass filter (LPF) and may filter out high frequency noise of the signal Vout. For example, the loop filter circuit 234 may include a resistor Rf and a capacitor Cf. A first end of the resistor Rf receives the signal Vout. A second end of the resistor Rf is coupled to a first end of the capacitor Cf, and a second end of the capacitor Cf is coupled to a reference potential (e.g., grounded). In another exemplary embodiment, a circuit structure of the loop filter circuit 234 may be adjusted based on practical needs.

The voltage controlled oscillator circuit 233 is configured to output the signal S3 based on the signal Vout, and a frequency of the signal S3 is controlled by the signal Vout. For example, when the voltage of the signal Vout increases, the frequency of the signal S3 may be increased. For example, when the voltage of the signal Vout drops, the frequency of the signal S3 may be decreased. Besides, the voltage controlled oscillator circuit 233 may feed the signal S3 back to the phase detector circuit 231.

The control circuit 24 is configured to detect the signal S3. In an exemplary embodiment, the control circuit 24 may detect signal quality evaluation information of the signal S3. For example, the control circuit 24 may detect the signal S3 and obtain a measured value of the signal S3 as the signal quality evaluation information of the signal S3. The measured value may reflect at least one of an eye width of the signal S3, an eye height of the signal S3, and a jitter value (or a jitter magnitude) of the signal S3.

In general, if the eye width and/or the eye height of the signal S3 is wider, sampling of the signal S3 may be easier and more accurate. Comparatively, if the eye width and/or the eye height of the signal S3 is narrower, the sampling of the signal S3 may be harder and less accurate. For example, the eye width and/or the eye height of the signal S3 may be obtained by depicting an eye diagram of the signal S3 or performing other signal analyzing means on the signal S3.

Based on the signal quality evaluation information of the signal S3, the control circuit 24 may output the signal SC. Based on the signal SC, a specific circuit parameter of the phase-locked loop circuit 23 may be adjusted. For example, based on the signal SC, at least one of a current, an impedance, and a gain of on a closed-loop path of the phase-locked loop circuit 23 may be adjusted. Taking FIG. 2 as an example, the phase detector circuit 231, the charge pump circuit 232, the voltage controlled oscillator circuit 233, and the loop filter circuit 234 are located on the closed-loop path of the phase-locked loop circuit 23. Therefore, based on the signal SC, a gain (Kpd) of the phase detector circuit 231, a current (Icp) flowing through the charge pump circuit 232, an impedance of the loop filter circuit 234, and/or a gain (Kvco) of the voltage controlled oscillator circuit 233 may be adjusted to calibrate the electronic parameter, such as the loop bandwidth and/or the loop jitter peaking, of the phase-locked circuit 23.

Figure 3A:
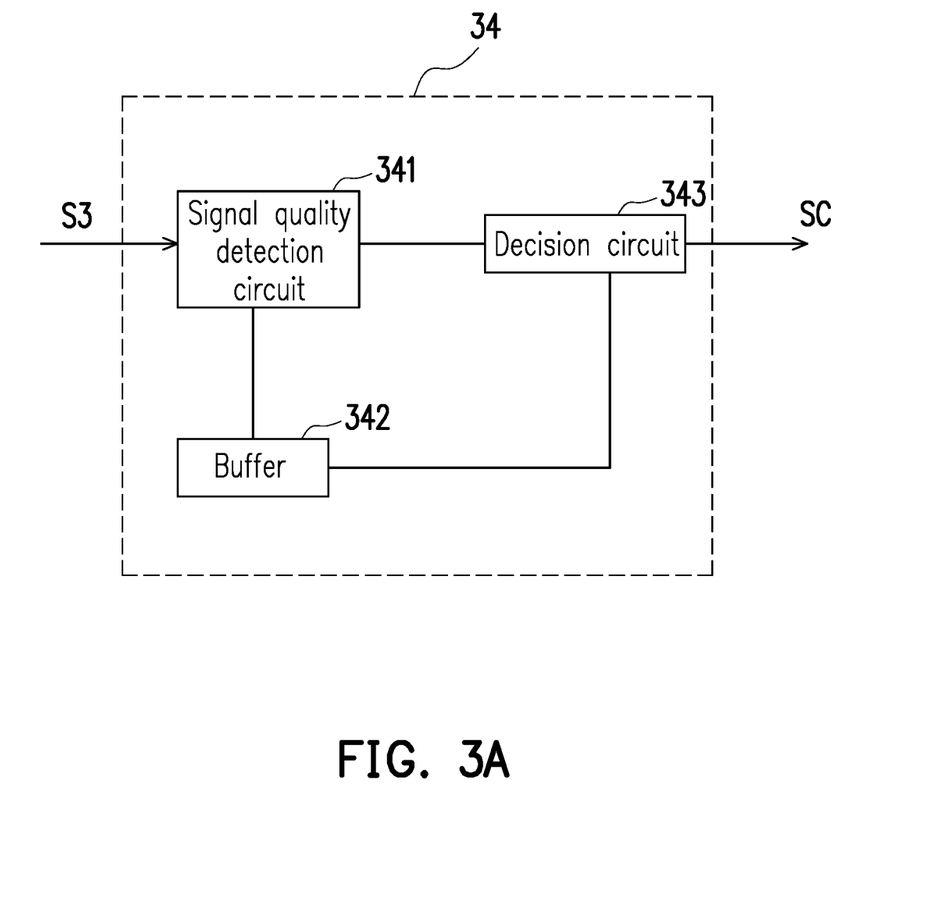
FIG. 3A is a schematic diagram illustrating a control circuit according to an exemplary embodiment of the disclosure.

FIG. 3A is a schematic diagram illustrating a control circuit according to an exemplary embodiment of the disclosure. Referring to FIGS. 2 and 3A, a control circuit 34 includes a signal quality detection circuit 341, a buffer 342, and a decision circuit 343. The signal quality detection circuit 341 is coupled to the buffer 342 and the decision circuit 343. The signal quality detection circuit 341 is configured to receive the signal S3 and analyze the signal S3 to obtain a measured value (i.e., the signal quality evaluation information) of the signal S3.

When calibrating the phase-locked loop circuit 23, the decision circuit 343 may generate the signal SC instructing to adopt different circuit parameters. Besides, when calibrating the phase-locked loop circuit 23, the decision circuit 343 may also adjust the frequency of the signal SJ. In correspondence to the specific circuit parameter of the phase-locked loop circuit 23 being changed and/or the frequency of the signal SJ being adjusted, at least one of the eye width, the eye height, and the jitter value of the signal S3 may be correspondingly changed. The signal quality detection circuit 341 may continuously detect and analyze the signal S3 to obtain the corresponding measured value. The signal quality detection circuit 341 may match the measured value and a parameter setting (e.g., the circuit parameter and/or the frequency of the signal SJ) adopted when the measured value is detected and store the matched measured value and the parameter setting to the buffer 342. The decision circuit 343 may read the stored measured values from the buffer 342 and compare the stored measured values. After continuously adjusting the specific circuit parameter of the phase-locked loop circuit 23 and/or the frequency of the signal SJ, the decision circuit 343 may generate the signal SC based on the measured value stored in the buffer 342. For example, according to the signal SC generated based on a measured value (e.g., the maximum eye width value, the maximum eye height value, or the minimum jitter value) stored in the buffer 342, the decision circuit 343 may instruct the phase-locked loop circuit 23 to adopt a specific circuit parameter (e.g., adjusting the gain of the voltage controlled oscillator circuit 233 to a specific value) to stabilize the loop bandwidth of the phase-locked loop circuit 23 and/or to control the loop bandwidth of the phase-locked loop circuit 23 within a specific range.

In an exemplary embodiment of FIGS. 2 and 3A, the decision circuit 343 may instruct the jitter control circuit 21 to set the frequency of the signal SJ at a specific frequency (also referred to a first frequency). Based on the signal S1 and the signal SJ having the first frequency, the jitter generation circuit 22 may generate the signal S2. The phase-locked loop circuit 23 may perform the phase-lock operation on the signal S2 to generate the signal S3. The signal quality detection circuit 341 may analyze the signal S3 to obtain a measured value (also referred to as a first measured value) of the signal S3 and record the first measured value in the buffer 342. The first measured value may reflect the eye width, the eye height, or the jitter value of the third signal (or the second signal) generated based on the signal SJ at the first frequency.

After obtaining the first measured value, the decision circuit 343 may determine a target value based on the first measured value and record the target value in the buffer 342. Then, the decision circuit 343 may instruct the jitter control circuit 21 to set the frequency of the signal SJ as another frequency (also referred to as a second frequency). Based on the signal S1 and the signal SJ having the second frequency, the jitter generation circuit 22 may generate the signal S2. The phase-locked loop circuit 23 may perform the phase-lock operation on the signal S2 to generate the signal S3. The signal quality detection circuit 341 may analyze the signal S3 to obtain another measured value (also referred to as a second measured value) of the signal S3 and record the second measured value in the buffer 342. The second measured value may reflect the eye width, the eye height, or the jitter value of the third signal (or the second signal) generated based on the signal SJ at the second frequency. The decision circuit 343 may calibrate the electronic parameter of the phase-locked loop circuit 23 based on the target value and the second measured value.

Figure 3B:
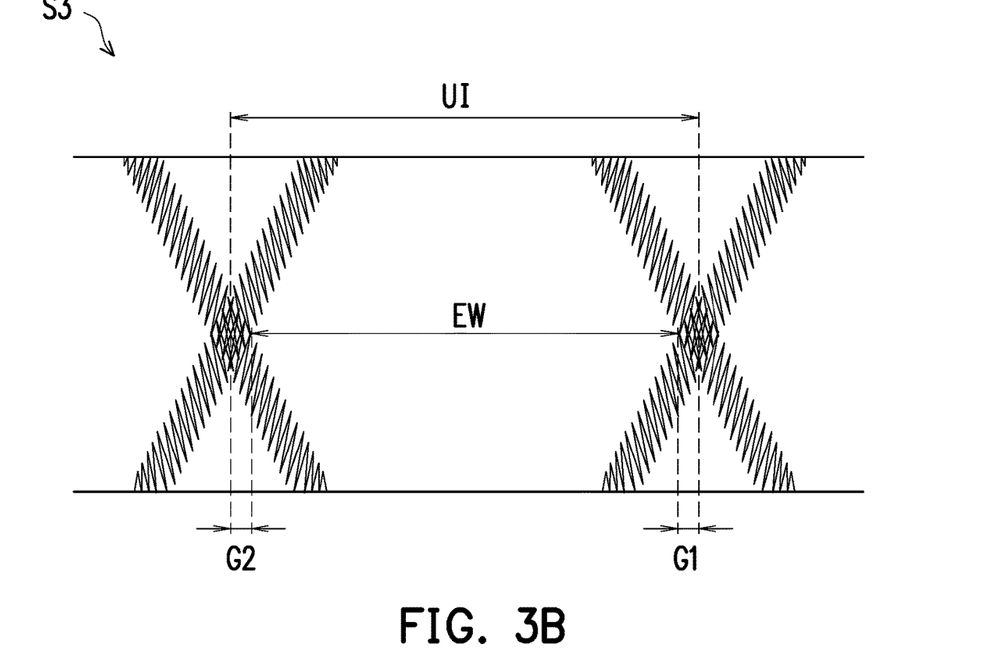
FIG. 3B is a schematic diagram illustrating a third signal according to an exemplary embodiment of the disclosure.
Figure 3C:
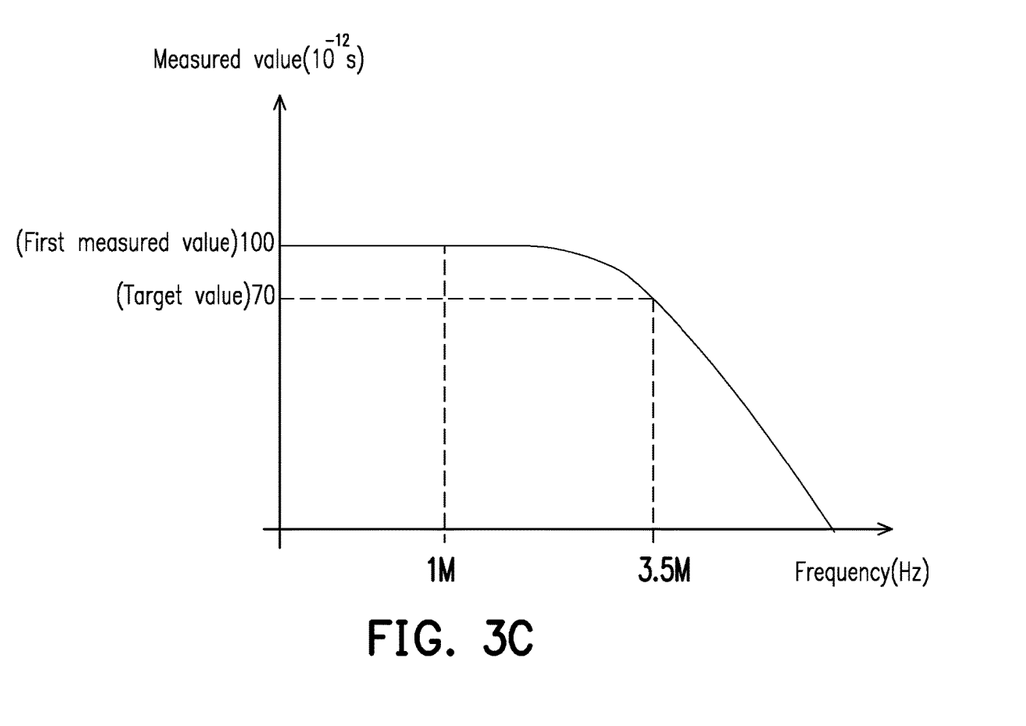
FIG. 3C is a curve diagram illustrating frequency in correspondence with measured value according to an exemplary embodiment of the disclosure.

FIG. 3B is a schematic diagram illustrating a third signal according to an exemplary embodiment of the disclosure. FIG. 3C is a curve diagram illustrating frequency in correspondence with measured value according to an exemplary embodiment of the disclosure.

Referring to FIGS. 3B and 3C, for an eye of the signal S3, a pulse width UI is equivalent to a sum of an eye width EW and a jitter value (G1+G2). A part marked with inclined lines (or jittering lines) indicates jittering of the signal S3. The first frequency (e.g., 1 MHz) corresponds to a power of 0 db (low frequency). The second frequency (e.g., 3.5 MHz) corresponds to a power of −3 db (target frequency). The first measured value reflects a jitter value of the third signal generated based on the signal SJ at the first frequency. The second measured value reflects a jitter value of the third signal generated based on the signal SJ at the second frequency. Assuming that the first measured value detected when the frequency of the signal SJ is the first frequency is 100 picoseconds, the target value of 70 picoseconds may be obtained by multiplying the first measured value with 0.707 (−3 db).

After adjusting the frequency of the signal SJ to the second frequency and detecting the second measured value, if the second measured value is not equal to (or not close to) the target value, one or more circuit parameters of the phase-locked loop circuit 23 may be continuously adjusted. After adjusting one or more circuit parameters of the phase-locked loop circuit 23, if the detected second measured value is equal to (or close to) the target value, the calibration of the electronic parameter, such as the loop bandwidth and/or the loop jitter peaking, of the phase-locked loop circuit 23 may be completed.

In an exemplary embodiment of FIG. 3A, the signal quality detection circuit 341 may include an eye width detector and/or an eye height detector. In addition, the control circuit 13, 24, or 34 may include a logic circuit component, such as a sampling circuit, a flip-flop, a comparator, a micro-processor, a micro-controller, and/or an embedded controller to achieve the aforementioned function.

It should be noted that, even though the exemplary embodiment of FIGS. 3B and 3C adopts the jitter value of the third signal as the example of the signal quality evaluation information, the disclosure does not intend to limit the type of the signal quality evaluation information. In another exemplary embodiment, other information (e.g., the eye width or the eye height of the third signal) related to the signal quality of the third signal may also serve as the signal quality evaluation information. As the type of the signal quality evaluation information changes, internal circuits of the control circuit and the functions of the internal circuits may also be changed correspondingly. Besides, the coupling relations of the circuit components described in the above exemplary embodiments are merely an example and shall not be construed as a limitation of the disclosure. In another exemplary embodiment, based on practical needs, more circuit components may be incorporated into the connection interface circuit to offer additional functions.

Figure 4:
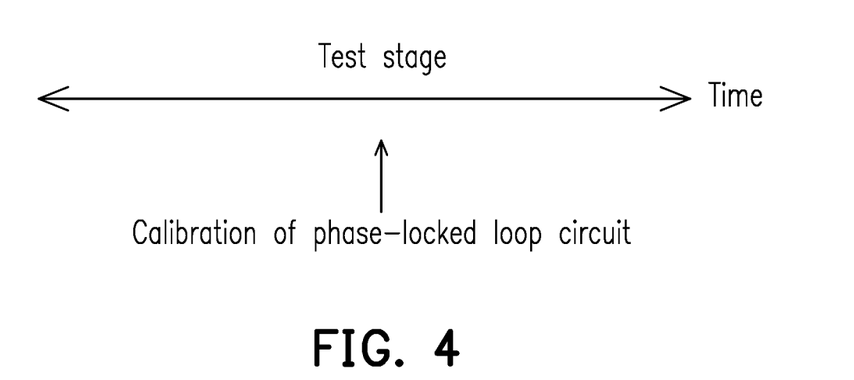
FIGS. 4 and 5 are schematic diagrams illustrating timing of calibrating a phase-locked loop circuit according to exemplary embodiments of the disclosure.
Figure 5:
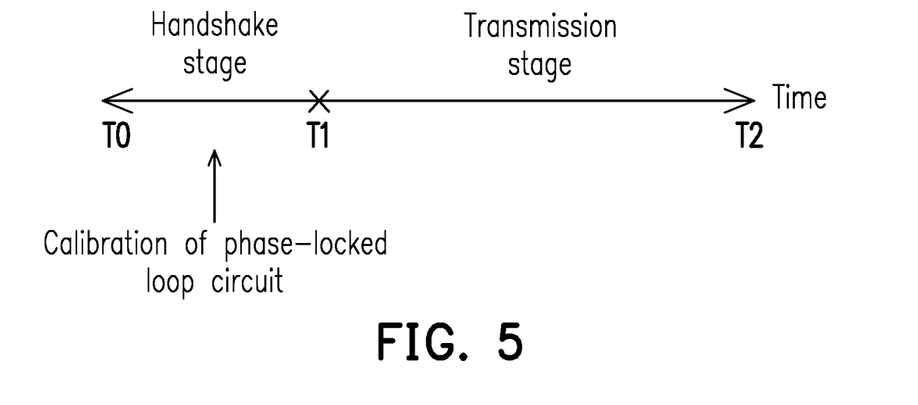

In the exemplary embodiment, the connection interface circuit 10 and/or 20 may be disposed in a memory storage device to receive the signal S1 from a host system. FIGS. 4 and 5 are schematic diagrams illustrating timing of calibrating a phase-locked loop circuit according to exemplary embodiments of the disclosure. In an exemplary embodiment, the calibration operation on the phase-locked loop circuit 12 and/or 23 may be carried out at a test stage of the memory storage device itself, as shown in FIG. 4. For example, the test stage may take place before the memory storage device is shipped out of the factory or during maintenance of the memory storage device. In the exemplary embodiment of FIG. 4, the host system is a test host, for example, and the signal S1 may be a test signal for calibrating the phase-locked loop circuit 12 and/or 23 at the test stage.

In an exemplary embodiment, the calibration operation on the phase-locked loop circuit 12 and/or 23 may be carried out at a handshake stage (i.e., between time points T0 and T1) between the memory storage device and the host system, as shown in FIG. 5. At the handshake stage, the memory storage device and the host system may transmit initial signals (also referred to as handshake signals) to each other to establish a connection. In other words, in the exemplary embodiment of FIG. 5, the signal S1 that is transmitted is an initial signal for establishing a connection between the host system and the memory storage device at the handshake stage. After the handshake stage is completed (i.e., after the time point T1), a transmission stage (i.e., between the time point T1 and a time point T2) may be entered. At the transmission stage, the memory storage device may analyze a data signal from the host system by using the calibrated phase-locked loop circuit 12 and/or 23.

Figure 6:
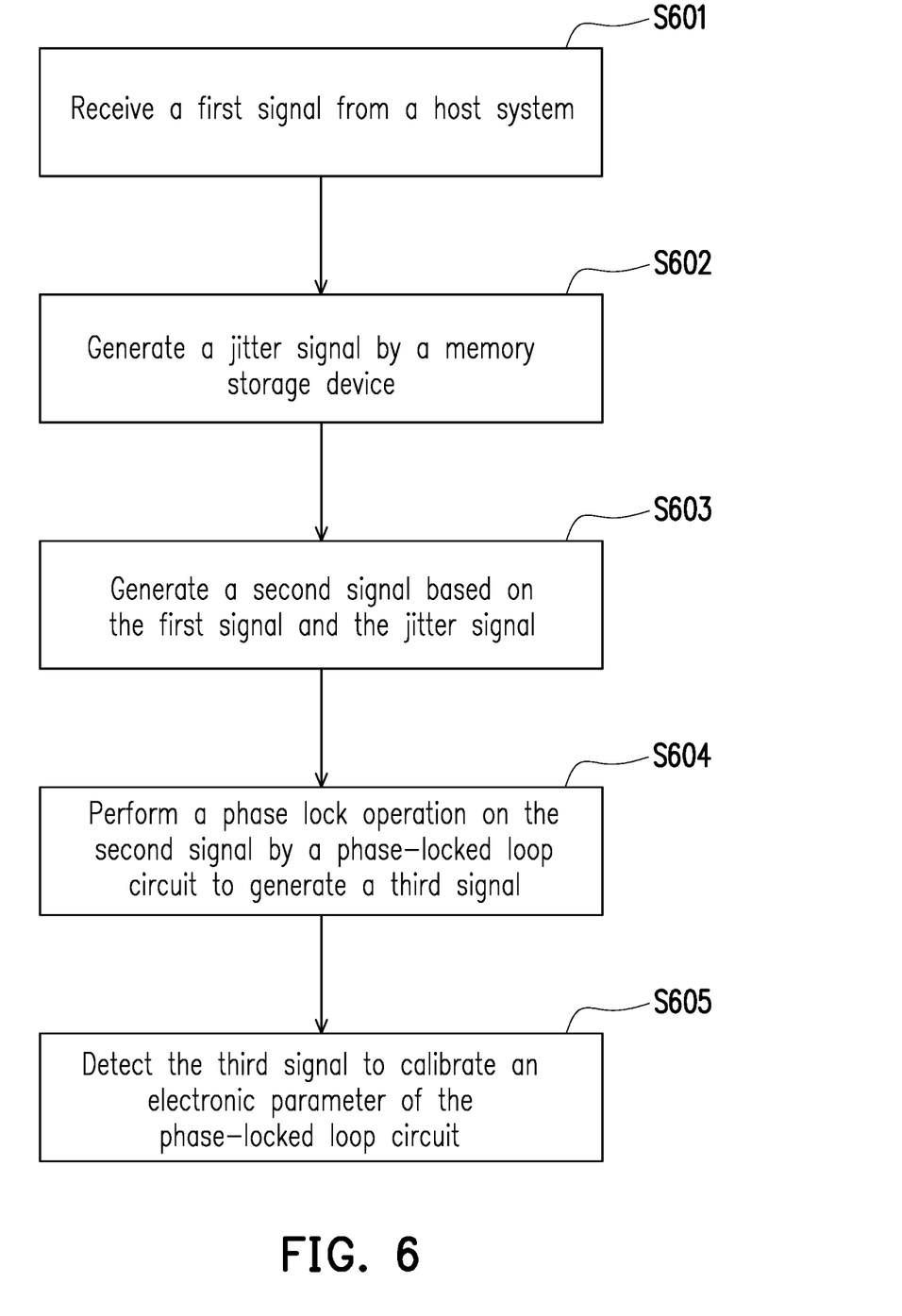
FIG. 6 is a flowchart illustrating a phase-locked loop circuit calibration method according to an exemplary embodiment of the disclosure.

FIG. 6 is a flowchart illustrating a phase-locked loop circuit calibration method according to an exemplary embodiment of the disclosure. Referring to FIG. 6, at Step S601, a first signal is received from a host system. At Step S602, a jitter signal is generated by a memory storage device. At Step S603, a second signal is generated based on the first signal and the jitter signal. At Step S604, a phase-locked loop circuit performs a phase-lock operation on the second signal to generate a third signal. At Step S605, the third signal is detected to calibrate an electronic parameter of the phase-locked loop circuit.

Details of the respective steps of FIG. 6 are already described above and thus will not be reiterated in the following. In addition, the respective steps of FIG. 6 may be implemented as a plurality of programming codes or circuits. The disclosure does not intend to impose any limitation on this regard. Besides, the method of FIG. 6 may be used with the exemplary embodiments or carried out independently. The disclosure does not intend to impose any limitation on this regard.

Generally speaking, a memory storage device (also referred to as a memory storage system) includes a rewritable non-volatile memory module and a controller (i.e. a control circuit). The memory storage device is usually used together with a host system, so that the host system may write data into or read data from the memory storage device.

Figure 7:
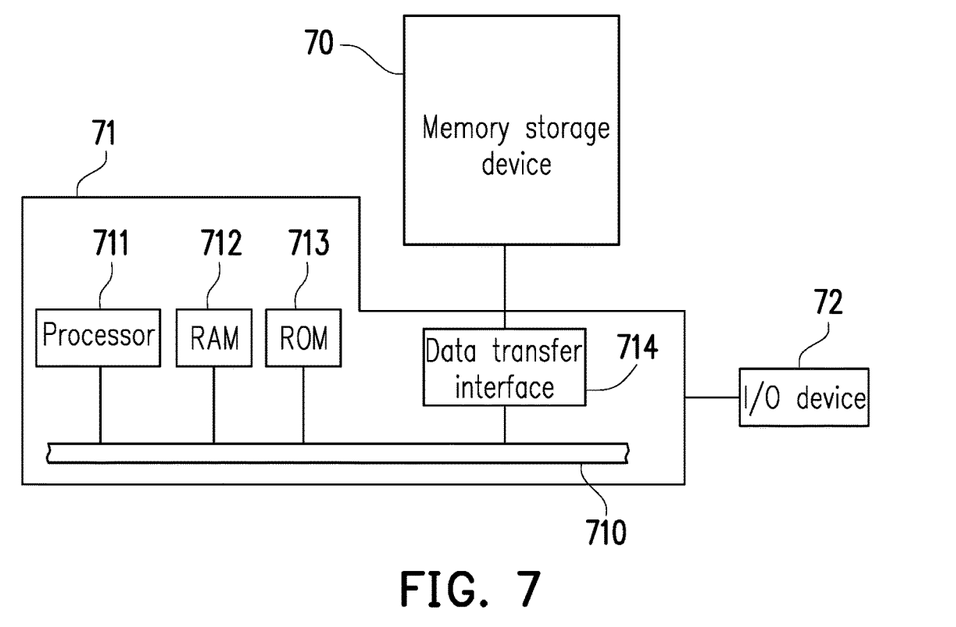
FIG. 7 is a schematic diagram illustrating a host system, a memory storage device, and an input/output (I/O) device according to an exemplary embodiment of the disclosure.
Figure 8:
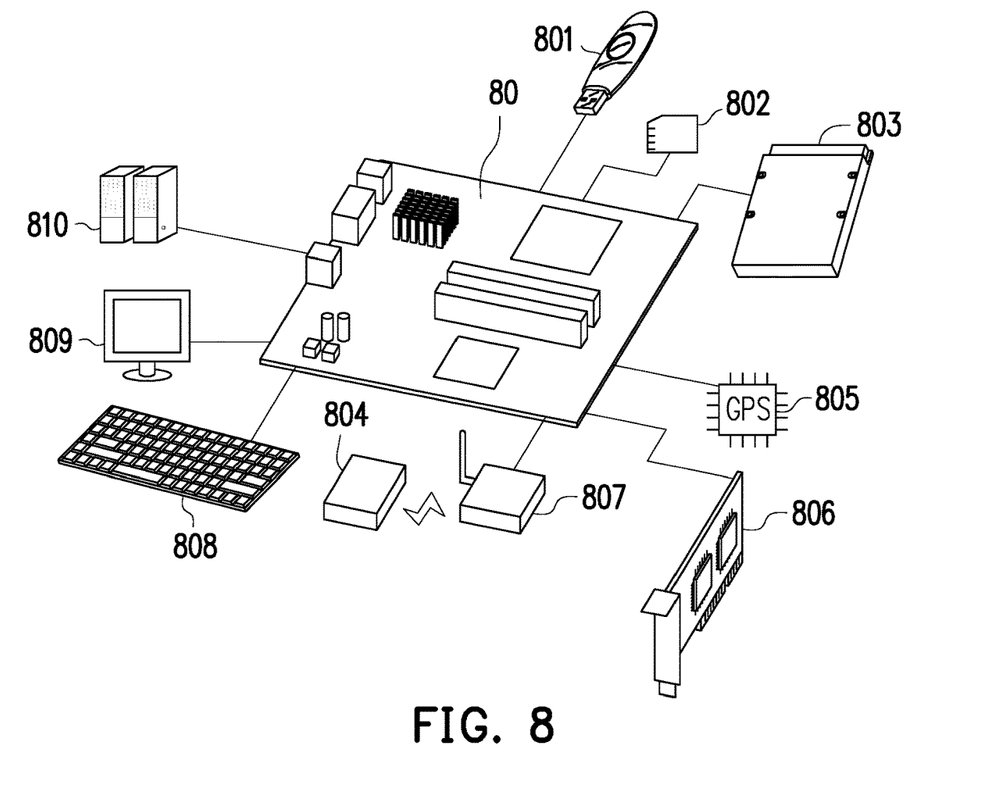
FIG. 8 is a schematic diagram illustrating a host system, a memory storage device, and an I/O device according to another exemplary embodiment of the disclosure.

FIG. 7 is a schematic diagram illustrating a host system, a memory storage device, and an input/output (I/O) device according to an exemplary embodiment of the disclosure. FIG. 8 is a schematic diagram illustrating a host system, a memory storage device, and an I/O device according to another exemplary embodiment of the disclosure.

Referring to FIGS. 7 and 8, a host system 71 includes a processor 711, a random access memory (RAM) 712, a read only memory (ROM) 713, and a data transfer interface 714. The processor 711, the random access memory 712, the read only memory 713, and the data transfer interface 714 are coupled to a system bus 710.

In the present exemplary embodiment, the host system 71 is coupled to a memory storage device 70 through the data transfer interface 714. For example, the host system 71 may store data into the memory storage device 70 or read data from the memory storage device 70 through the data transfer interface 714. In addition, the host system 71 is coupled to the I/O device 72 through the system bus 710. For example, the host system 71 may transmit an output signal to the I/O device 72 or receive an input signal from the I/O device 72 through the system bus 710.

In the present exemplary embodiment, the processor 711, the random access memory 712, the read only memory 713, and the data transfer interface 714 may be disposed on a motherboard 80 of the host system 71. The number of the data transfer interface 714 may be one or plural. The motherboard 80 may be coupled to the memory storage device 70 in a wired or wireless manner through the data transfer interface 714. The memory storage device 70 may be, for example, a flash drive 801, a memory card 802, a solid state drive (SSD) 803, or a wireless memory storage device 804. The wireless memory storage device 804 may be, for example, a memory storage device based on various wireless communication techniques, such as a near field communication (NFC) memory storage device, a WiFi memory storage device, a Bluetooth memory storage device, or a Bluetooth low energy (BLE) memory storage device (e.g., iBeacon), etc. In addition, the motherboard 80 may also be coupled to various I/O devices, such as a global positioning system (GPS) module 805, a network interface card 806, a wireless transmission device 807, a keyboard 808, a display screen 809, a speaker 810, etc., through the system bus 710. For example, in an exemplary embodiment, the motherboard 80 may access the wireless memory storage device 804 through the wireless transmission device 807.

In an exemplary embodiment, the host system as described may be substantially any arbitrary system compatible with the memory storage device for data storage.

Figure 9:
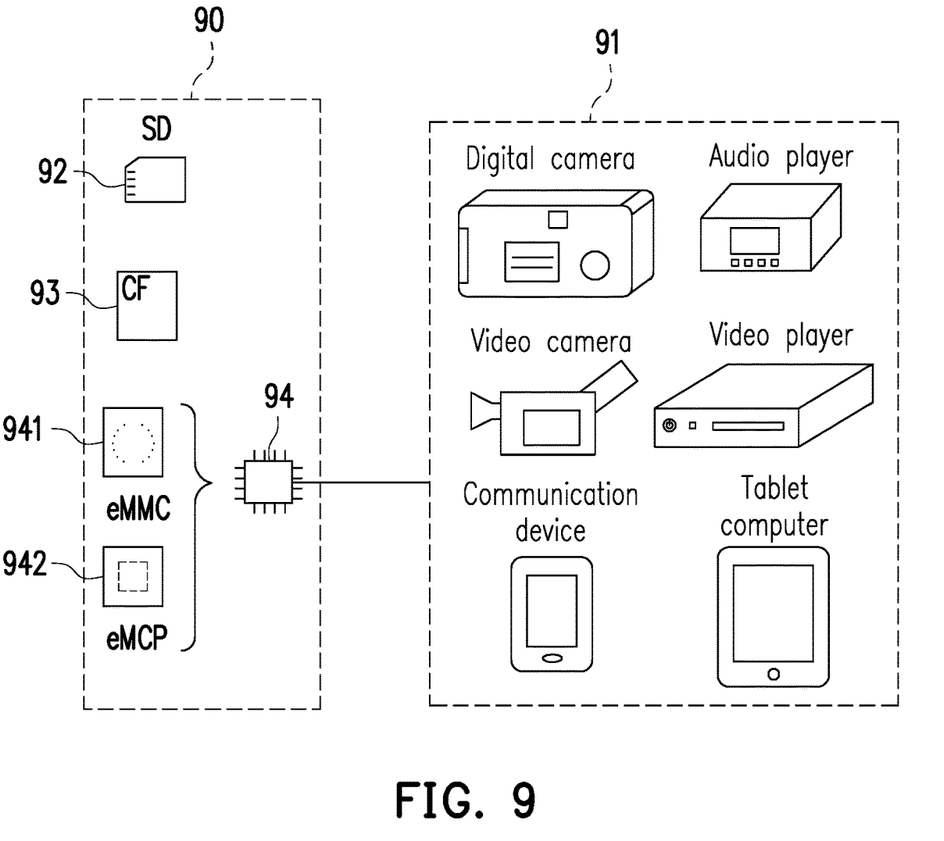
FIG. 9 is a schematic diagram illustrating a host system and a memory storage device according to another exemplary embodiment of the disclosure.

Even though in the exemplary embodiment, the host system is described as a computer system, FIG. 9 is a schematic diagram illustrating a host system and a memory storage device according to another exemplary embodiment of the disclosure. Referring to FIG. 9, in the another exemplary embodiment, a host system 91 may also be a system such as a digital camera, a video camera, a communication device, an audio player, a video player, or a tablet computer, etc., and a memory storage device 90 may be various non-volatile memory storage devices, such as a secure digital (SD) card 92, a compact flash (CF) card 93, or an embedded storage device 94, etc., used by the host system 91. The embedded storage device 94 includes various embedded storage devices, such as an embedded multimedia card (eMMC) 941 and/or an embedded multi chip package (eMCP) storage device 942, that are directly coupled to a substrate of the host system.

Figure 10:
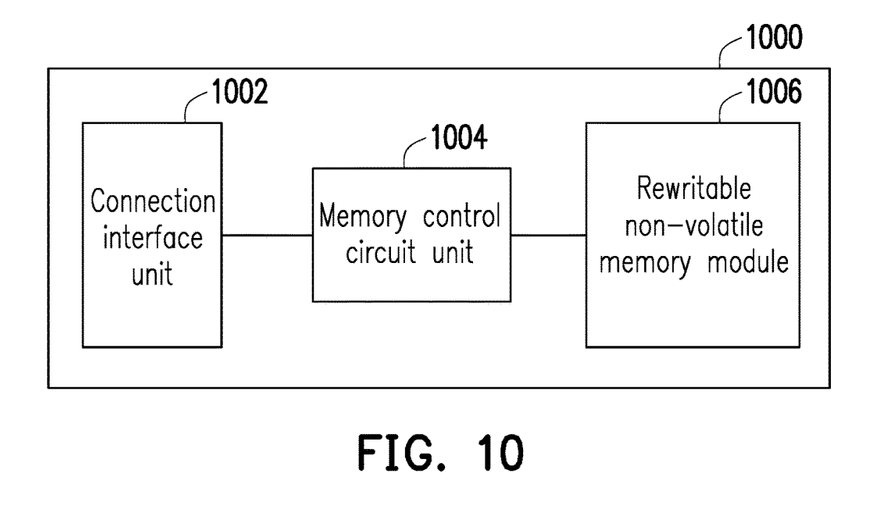
FIG. 10 is a schematic block diagram illustrating a memory storage device according to an exemplary embodiment of the disclosure.

FIG. 10 is a schematic block diagram illustrating a memory storage device according to an exemplary embodiment of the disclosure.

Referring to FIG. 10, a memory storage device 1000 includes a connection interface unit 1002, a memory control circuit unit 1004, and a rewritable non-volatile memory module 1006. The connection interface unit 1002 may include the connection interface circuit 10 in the exemplary embodiment of FIG. 1 or the connection interface circuit 20 in the exemplary embodiment of FIG. 2.

The connection interface unit 1002 may couple the memory storage device 1000 to the host system 71. In the present exemplary embodiment, the connection interface unit 1002 is compatible with the Serial Advanced Technology Attachment (SATA) standard. However, the disclosure is not limited thereto. The connection interface unit 1002 may also be compatible with the Parallel Advanced Technology Attachment (PATA) standard, the Institute of Electrical and Electronic Engineers (IEEE) 1394 standard, the Peripheral Component Interconnect (PCI) Express standard, the Universal Serial Bus (USB) standard, the SD interface standard, the Ultra High Speed-I (UHS-I) interface standard, the Ultra High Speed-II (UHS-II) interface standard, the Memory Stick (MS) interface standard, the MCP interface standard, the MMC interface standard, the eMMC interface standard, the Universal Flash Storage (UFS) interface standard, the eMCP interface standard, the CF interface standard, the Integrated Device Electronics (IDE) standard, or other suitable standards. The connection interface unit 1002 and the memory control circuit unit 1004 may be packaged in the same chip, or the connection interface unit 1002 may be disposed outside a chip including the memory control circuit unit 1004.

The memory control circuit unit 1004 may execute a plurality of logical gates or control commands implemented in a hardware form or firmware form, and perform data writing, reading, and erasing operations in the rewritable non-volatile memory module 1006 according to commands of the host system 71.

The rewritable non-volatile memory module 1006 is coupled to the memory control circuit unit 1004 and stores data written by the host system 71. The rewritable non-volatile memory module 1006 may be a single level cell (SLC) NAND flash memory module (i.e., a flash memory module where one memory cell stores one bit), a multi level cell (MLC) NAND flash memory module (i.e., a flash memory module where one memory cell stores two bits), a triple level cell (TLC) NAND flash memory module (i.e., a flash memory module where one memory cell stores three bits), other flash memory modules, or other memory modules exhibiting similar characteristics.

Each memory cell of the rewritable non-volatile memory module 1006 may store one or more bits through changes of a voltage (also referred to as a threshold voltage). Specifically, a charge storage layer is provided between a control gate and a channel of each memory cell. By applying a read voltage to the control gate, electrons of the charge storage layer may be changed, thereby changing the threshold voltage of the memory cell. The operation of changing the threshold voltage of the memory cell is also referred to as "writing data to a memory cell" or "programming a memory cell". Through the change of the threshold voltage, each memory cell of the rewritable non-volatile memory module 406 may have a plurality of storage states. By applying a read voltage, which of the storage states a memory cell belongs to may be determined. Accordingly, the one or more bits stored in the memory cell may be accessed.

In the present exemplary embodiment, the memory cells of the rewritable non-volatile memory module 1006 may form a plurality of physical programming units, and the physical programming units may form a plurality of physical erasing units. Specifically, memory cells on the same word line may form one or more physical programming units. If each memory cell stores two or more bits, the physical programming units on the same word line may at least be classified into a lower physical programming unit and an upper physical programming unit. For example, a least significant bit (LSB) of a memory cell belongs to the lower physical programming unit, and a most significant bit (MSB) of a memory cell belongs to the upper physical programming unit. In general, in an MLC NAND flash memory, a writing speed of the lower physical programming unit is faster than a writing speed of the upper physical programming unit, and/or the reliability of the lower physical programming unit is higher than the reliability of the upper physical programming unit.

In the present exemplary embodiment, the physical programming unit is a minimum unit for programming. In other words, the physical programming unit is a minimum unit for data writing. For example, the physical programming unit is a physical page or a physical sector. If the physical programming unit is a physical page, the physical programming units normally include a data bit area and a redundancy bit area. The data bit area includes a plurality of physical sectors storing user data, and the redundancy bit area stores system data (e.g., management data such as error correcting codes). In the present exemplary embodiment, the data bit area includes 32 physical sectors, and the size of each physical sector is 512 bytes. However, in other exemplary embodiments, the data bit area may also include 8, 16, or a greater or fewer number of physical sectors, and the size of each physical sector may be greater or smaller. Besides, the physical erasing unit is a minimum unit for erasing. In other words, each physical erasing unit includes the minimum number of memory cells to be erased together. For example, the physical erasing unit is a physical block.

In view of the foregoing, after the first signal is received form the host system, the second signal may be generated based on the first signal and the jitter signal generated by the memory storage device itself. After the phase-lock operation is performed on the second signal to generate the third signal, the third signal may be detected to calibrate the electronic parameter of the phase-locked loop circuit. Accordingly, the efficiency of calibrating the electronic parameter of the phase-locked loop circuit is facilitated.

The previously described exemplary embodiments of the present disclosure have the advantages aforementioned, wherein the advantages aforementioned not required in all versions of the disclosure.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims and their equivalents.

What is claimed is:

1. A phase-locked loop circuit calibration method for a memory storage device comprising a rewritable non-volatile memory module, the phase-locked loop circuit calibration method comprising:
   receiving a first signal from a host system;
   generating a jitter signal by the memory storage device;
   generating a second signal based on the first signal and the jitter signal;
   performing a phase-lock operation on the second signal by a phase-locked loop circuit to generate a third signal; and
   detecting the third signal to calibrate an electronic parameter of the phase-locked loop circuit,
   wherein the first signal is an initial signal for establishing a connection between the host system and the memory storage device at a handshake stage.

2. The phase-locked loop circuit calibration method as claimed in claim 1, wherein a frequency of the jitter signal is not higher than a frequency of the first signal.

3. The phase-locked loop circuit calibration method as claimed in claim 1, wherein the step of detecting the third signal to calibrate the electronic parameter of the phase-locked loop circuit comprises:
   adjusting at least one circuit parameter of the phase-locked loop circuit to calibrate a loop bandwidth or a loop jitter peaking of the phase-locked loop circuit.

4. The phase-locked loop circuit calibration method as claimed in claim 3, wherein the step of adjusting the at least one circuit parameter of the phase-locked loop circuit comprises:
   adjusting at least one of a current, an impedance, and a gain on a closed-loop path of the phase-locked loop circuit.

5. The phase-locked loop circuit calibration method as claimed in claim 1, wherein the step of detecting the third signal to calibrate the electronic parameter of the phase-locked loop circuit comprises:
   detecting signal quality evaluation information of the third signal; and
   calibrating the electronic parameter of the phase-locked loop circuit based on the signal quality evaluation information.

6. The phase-locked loop circuit calibration method as claimed in claim 5, wherein the step of detecting the signal quality evaluation information of the third signal comprises:
   obtaining a measured value of the third signal, wherein the measured value reflects one of an eye width of the third signal, an eye height of the third signal, and a jitter value of the third signal.

7. The phase-locked loop circuit calibration method as claimed in claim 1, wherein the step of detecting the third signal to calibrate the electronic parameter of the phase-locked loop circuit comprises:
   setting a frequency of the jitter signal as a first frequency;

obtaining a first measured value of the third signal after performing the phase-lock operation on the second signal generated based on the first signal and the jitter signal having the first frequency;

determining a target value based on the first measured value;

setting the frequency of the jitter signal as a second frequency, wherein the second frequency differs from the first frequency;

obtaining a second measured value of the third signal after performing the phase-lock operation on the second signal generated based on the first signal and the jitter signal having the second frequency; and calibrating the electronic parameter of the phase-locked loop circuit based on the target value and the second measured value.

8. The phase-locked loop circuit calibration method as claimed in claim 1, wherein the first signal further comprises a test signal for calibrating the phase-locked loop circuit at a test stage.

9. The phase-locked loop circuit calibration method as claimed in claim 1, wherein the jitter signal is adapted to adjust the first signal such that at least one rising edge or at least one falling edge of a bit stream of the second signal has a time shift of a different amount.

10. A memory storage device, comprising:
a connection interface unit, coupled to a host system;
a rewritable non-volatile memory module; and
a memory control circuit unit, coupled to the connection interface unit and the rewritable non-volatile memory module,
wherein the connection interface unit comprises a phase-locked loop circuit,
wherein the connection interface unit is configured to receive a first signal from the host system,
wherein the connection interface unit is further configured to generate a jitter signal,
wherein the connection interface unit is further configured to generate a second signal based on the first signal and the jitter signal,
wherein the phase-locked loop circuit is configured to perform a phase-lock operation on the second signal to generate a third signal, and
wherein the connection interface unit is further configured to detect the third signal to calibrate an electronic parameter of the phase-locked loop circuit,
wherein the first signal is an initial signal for establishing a connection between the host system and the memory storage device at a handshake stage.

11. The memory storage device as claimed in claim 10, wherein a frequency of the jitter signal is not higher than a frequency of the first signal.

12. The memory storage device as claimed in claim 10, wherein the operation that the connection interface unit detects the third signal to calibrate the electronic parameter of the phase-locked loop circuit comprises:
adjusting at least one circuit parameter of the phase-locked loop circuit to calibrate a loop bandwidth or a loop jitter peaking of the phase-locked loop circuit.

13. The memory storage device as claimed in claim 12, wherein the operation that the connection interface unit adjusts the at least one circuit parameter of the phase-locked loop circuit comprises:
adjusting at least one of a current, an impedance, and a gain on a closed-loop path of the phase-locked loop circuit.

14. The memory storage device as claimed in claim 10, wherein the operation that the connection interface unit detects the third signal to calibrate the electronic parameter of the phase-locked loop circuit comprises:
detecting signal quality evaluation information of the third signal; and
calibrating the electronic parameter of the phase-locked loop circuit based on the signal quality evaluation information.

15. The memory storage device as claimed in claim 14, wherein the operation that the connection interface unit detects the signal quality evaluation information of the third signal comprises:
obtaining a measured value of the third signal, wherein the measured value reflects one of an eye width of the third signal, an eye height of the third signal, and a jitter value of the third signal.

16. The memory storage device as claimed in claim 10, wherein the operation that the connection interface unit detects the third signal to calibrate the electronic parameter of the phase-locked loop circuit comprises:
setting a frequency of the jitter signal as a first frequency;
obtaining a first measured value of the third signal after performing the phase-lock operation on the second signal generated based on the first signal and the jitter signal having the first frequency;
determining a target value based on the first measured value;
setting the frequency of the jitter signal as a second frequency, wherein the second frequency differs from the first frequency;
obtaining a second measured value of the third signal after performing the phase-lock operation on the second signal generated based on the first signal and the jitter signal having the second frequency; and
calibrating the electronic parameter of the phase-locked loop circuit based on the target value and the second measured value.

17. The memory storage device as claimed in claim 10, wherein the first signal further comprises a test signal for calibrating the phase-locked loop circuit at a test stage.

18. The memory storage device as claimed in claim 10, wherein the jitter signal is adapted to adjust the first signal such that at least one rising edge or at least one falling edge of a bit stream of the second signal has a time shift of a different amount.

19. A connection interface circuit for connecting a memory storage device to a host system, the connection interface circuit comprising:
a jitter control circuit, configured to generate a jitter signal;
a jitter generation circuit, coupled to the jitter control circuit and configured to receive a first signal from the host system and generate a second signal based on the first signal and the jitter signal;
a phase-locked loop circuit, coupled to the jitter generation circuit and configured to perform a phase-lock operation on the second signal to generate a third signal; and
a control circuit, coupled to the phase-locked loop circuit and the jitter control circuit and configured to detect the third signal to calibrate a circuit parameter of the phase-locked loop circuit,
wherein the first signal is an initial signal for establishing a connection between the host system and the memory storage device at a handshake stage.

20. The connection interface circuit as claimed in claim 19, wherein a frequency of the jitter signal is not higher than a frequency of the first signal.

21. The connection interface circuit as claimed in claim 19, wherein the operation that the control circuit detects the third signal to calibrate the electronic parameter of the phase-locked loop circuit comprises:
    adjusting at least one circuit parameter of the phase-locked loop circuit to calibrate a loop bandwidth or a loop jitter peaking of the phase-locked loop circuit.

22. The connection interface circuit as claimed in claim 21, wherein the operation that the control circuit adjusts the at least one circuit parameter of the phase-locked loop circuit comprises:
    adjusting at least one of a current, an impedance, and a gain on a closed-loop path of the phase-locked loop circuit.

23. The connection interface circuit as claimed in claim 19, wherein the operation that the control circuit detects the third signal to calibrate the electronic parameter of the phase-locked loop circuit comprises:
    detecting signal quality evaluation information of the third signal; and
    calibrating the electronic parameter of the phase-locked loop circuit based on the signal quality evaluation information.

24. The connection interface circuit as claimed in claim 23, wherein the operation that the control circuit detects the signal quality evaluation information of the third signal comprises:
    obtaining a measured value of the third signal, wherein the measured value reflects one of an eye width of the third signal, an eye height of the third signal, and a jitter value of the third signal.

25. The connection interface circuit as claimed in claim 19, wherein the operation that the control circuit detects the third signal to calibrate the electronic parameter of the phase-locked loop circuit comprises:
    setting a frequency of the jitter signal as a first frequency;
    obtaining a first measured value of the third signal after performing the phase-lock operation on the second signal generated based on the first signal and the jitter signal having the first frequency;
    determining a target value based on the first measured value;
    setting the frequency of the jitter signal as a second frequency, wherein the second frequency differs from the first frequency;
    obtaining a second measured value of the third signal after performing the phase-lock operation on the second signal generated based on the first signal and the jitter signal having the second frequency; and
    calibrating the electronic parameter of the phase-locked loop circuit based on the target value and the second measured value.

26. The connection interface circuit as claimed in claim 19, wherein the first signal further comprises a test signal for calibrating the phase-locked loop circuit at a test stage.

27. The connection interface circuit as claimed in claim 19, wherein the jitter signal is adapted to adjust the first signal such that at least one rising edge or at least one falling edge of a bit stream of the second signal has a time shift of a different amount.

\* \* \* \* \*